United States Patent [19]

Miner et al.

[11] Patent Number: 5,835,431
[45] Date of Patent: Nov. 10, 1998

[54] METHOD AND APPARATUS FOR WAFER TEST OF REDUNDANT CIRCUITRY

[75] Inventors: Daniel G. Miner, Austin; Brian Snider, Round Rock, both of Tex.

[73] Assignee: Integrated Device Technology, Inc., Santa Clara, Calif.

[21] Appl. No.: 924,302

[22] Filed: Sep. 5, 1997

[51] Int. Cl.[6] ..................................... G11O 7/60
[52] U.S. Cl. ............... 365/201; 365/189.02; 365/200
[58] Field of Search ................. 365/200, 201, 365/189.02, 205, 182.03

[56] References Cited

U.S. PATENT DOCUMENTS

| | | | |
|---|---|---|---|
| 4,691,301 | 9/1987 | Anderson | 365/200 |
| 5,134,585 | 7/1992 | Murakami et al. | 365/200 |
| 5,278,793 | 1/1994 | Yeh | 365/200 |
| 5,537,665 | 7/1996 | Patel et al. | 365/182.03 |
| 5,544,106 | 8/1996 | Koike | 365/200 |
| 5,625,725 | 4/1997 | Suma et al. | 365/200 |
| 5,631,868 | 5/1997 | Termullo, Jr. et al. | 365/200 |
| 5,633,826 | 5/1997 | Tsukada | 365/200 |
| 5,675,543 | 10/1997 | Rieger | 365/200 |
| 5,732,029 | 3/1998 | Lee et al. | 365/200 |

*Primary Examiner*—David C. Nelms
*Assistant Examiner*—Tuan Nguyen
*Attorney, Agent, or Firm*—James W. Huffman

[57] ABSTRACT

A method and apparatus for testing redundant circuitry within a memory array is provided. A control unit is described to interface a memory array to a wafer tester to selectively enable redundant rows/columns within a memory array during wafer test, without requiring permanent alteration of row/column select switches. Temporary enabling of redundant rows/columns allows testing of redundancy prior to alteration of the permanent switch logic. The control unit, upon command from a wafer tester, selectively enables particular redundant rows/columns to allow those redundant rows/columns to be tested. After testing, if the redundant rows/columns repair memory defects, permanent switch logic may be altered, without requiring further testing of the redundant circuitry.

25 Claims, 4 Drawing Sheets

METHOD AND APPARATUS FOR WAFER TEST OF REDUNDANT CIRCUITRY

BACKGROUND OF THE INVENTION

1. Field of the Invention

This invention relates in general to the field of semiconductor testing, and more specifically to a method and apparatus for testing redundant memory cells during wafer test.

2. Description of the Related Art

Semiconductor memory is used for the temporary storage of data and instructions to be utilized within a computing system. Such memory may be provided by DRAM chips, SRAM chips, or often is incorporated within a microprocessor. The semiconductor memory, whether manufactured as external memory, or as part of a microprocessor, contains millions of memory cells each of which must be tested, and must be fully functional for proper operation of a computing system.

During fabrication of semiconductor memory, one technique that is used to increase the production yield, is to provide redundant memory cells to allow replacement of defective memory cells, if they exist. Memory cells are typically arranged into a matrix of rows and columns, wherein the redundant element would be either a row of memory cells, or a column of memory cells, or both. If, for example, one memory cell in a given column is determined to be defective, this classifies the entire memory column as defective. The defective column can then be replaced by a redundant column making the device fully operational.

Replacement of a defective row/column within a memory array, with a redundant row/column requires the defective row/column to be detected and disabled. Furthermore, the redundant row/column must be enabled so that addressing of a memory cell within a defective row/column could be provided for by the redundant row/column.

Circuitry that allows replacement of defective rows/columns with redundant rows/columns is often provided in the form of switches connected to fuses. During manufacture, the switches are fabricated with the fuses intact, thereby selecting the normal rows/columns. However, if a defective memory cell is detected, a fuse associated with the row/column containing the defective memory cell is blown, disabling the defective row/column, and enabling the redundant row/column in its place.

While the fuse and switch arrangement for disabling a defective row/column, and enabling a redundant row/column, provides higher yield in memory fabrication, the process required to adequately insure that the redundancy produces a functional memory, is costly and cumbersome.

For example, memory is often tested when the memory array is still part of the semiconductor wafer on which it is manufactured. More specifically, a semiconductor wafer is placed on a wafer tester, that sequences through all of the chips on the wafer, testing the chips for proper functionality. If the tester determines that a memory cell within a memory array is defective, the tester records the row/column of the defective memory cell, and later reports the defect to the manufacturer. If the defective memory cell can be replaced by a redundant row/column, the wafer is removed from the tester, and a fuse is blown that disables the defective row/column, and enables the redundant row/column.

At this point, it is not known whether blowing the fuse has repaired the defect, since the memory cells within the redundant row/column have not yet been tested. After blowing the appropriate fuse, the wafer is placed back on the tester and re-tested. If the redundant row/column did not contain any defective memory cells, then the steps of blowing the fuse, and re-testing, of the memory have salvaged an otherwise defective memory. On the other hand, if the redundant row/column contains a defective memory cell, it is not known until after the expense and time has been incurred to blow the fuse and re-test the memory. Removing a wafer from a wafer tester, blowing a fuse, and re-testing the wafer is very costly.

Therefore, what is needed is a method and apparatus that allows temporary disabling of a defective memory row/column, and enabling of a redundant row/column, by a tester, without requiring the wafer containing the memory to be removed from the tester, and without requiring a fuse to be blown.

SUMMARY

To address the above-detailed deficiencies, it is an object of the present invention to provide a method and apparatus that allows testing of redundant rows or columns within a memory array to be performed prior to permanently enabling the redundant rows or columns.

Accordingly, in the attainment of the aforementioned object, it is a feature of the present invention to provide an apparatus that selectively enables a redundant memory column or row, or both within a memory array. The apparatus includes adjacent memory columns, selection logic, permanent selection logic, and control logic. The adjacent memory columns have at least one redundant memory column. The selection logic is coupled to at least two of the adjacent memory columns, and selects as an output one of the adjacent memory columns. The selection logic default selects a first one of the adjacent memory columns. The selection logic includes permanent selection logic that causes the selection logic to permanently select as an output a second one of the adjacent memory columns. The control logic is coupled to the selection logic and causes the selection logic to temporarily select as an output the second one of the adjacent memory columns, for testing.

An advantage of the present invention is that memory cells within redundant rows and columns may be tested, prior to physically altering the fuse selection associated with defective rows and columns.

Another object of the present invention is to eliminate re-testing the memory array after enabling a redundant row or column, just to determine whether the redundant row or column contains defective memory cells.

In another aspect, it is a feature of the present invention to provide a memory array that includes a plurality of memory cells, a plurality of redundant memory cells, selection logic, permanent switch logic, and a control unit. The plurality of memory cells are arranged into a matrix of rows and columns. The plurality of redundant memory cells are arranged to selectively replace defective memory cells in a row or a column. The selection logic is coupled to the matrix of rows and columns, and to the plurality of redundant memory cells, to disable/enable selection of the plurality of redundant memory cells. The selection logic further includes permanent switch logic that is fabricated to disable selection of the plurality of redundant memory cells, but is alterable to allow permanent enabling of the redundant memory cells. The control unit is coupled to the selection logic to temporarily enable the plurality of redundant memory cells for testing.

An advantage of the present invention is that once defective memory cells are detected within a memory array, the redundant rows or columns may be tested, without having to remove the wafer from the wafer tester, blow a fuse to enable the redundant rows or columns, and re-install the wafer on the wafer tester.

In another aspect, it is a feature of the present invention to provide a microprocessor having a data cache, the data cache having a plurality of addressable memory rows, each of the memory rows having a plurality of memory columns. In an alternative embodiment, the microprocessor may have an instruction cache, also having a plurality of addressable memory rows, each of the memory rows having a plurality of memory columns. The microprocessor includes a redundant memory column, switch logic, permanently alterable switch control and a control unit. The redundant memory column can replace one of the plurality of memory columns, if a defective memory cell is found. The switch logic is coupled to the plurality of memory columns, and to the redundant memory column, to default enable all of the plurality of memory columns, and disable the redundant memory column. The permanently alterable switch control is coupled to the switch logic to permanently disable one of the plurality of memory columns, and to permanently enable the redundant memory column. The control unit is coupled to the switch logic to temporarily disable one of the plurality of memory columns, and to temporarily enable the redundant memory column, during a manufacturing test.

In yet another aspect, it is a feature of the present invention to provide a method to test a memory array during wafer test. The method includes exercising the memory array to determine if memory cells are defective, tracking which of the memory cells, if any, are defective. And, if a memory cell is defective, temporarily disabling row or column to temporarily enable the redundant memory row or column, and exercising the memory array to determine if any memory cells in the redundant row or column are defective.

An advantage of the present invention is that all of the memory cells within a memory array, including the redundant memory cells, may be tested during the first wafer test.

BRIEF DESCRIPTION OF THE DRAWINGS

These and other objects, features, and advantages of the present invention will become better understood with regard to the following description, and accompanying drawings where.

DETAILED DESCRIPTION

The present invention provides a method and apparatus that allows redundant circuitry within a memory array to be tested, during wafer test, without first requiring fuses to be permanently blown to disable defective memory rows/ columns, and enable the redundant rows/columns. However, before describing the method and apparatus in detail, a brief overview will be provided to illustrate the environment within which the present invention is most applicable.

Figure 1:
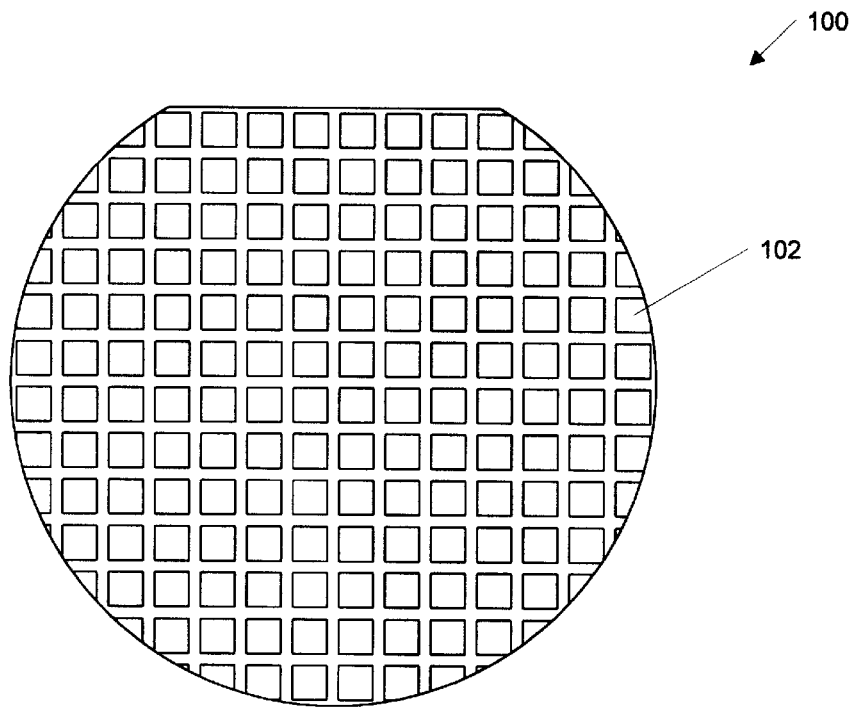
FIG. 1 is a schematic representation of a semiconductor wafer containing a number of separate semiconductor devices.

Referring to FIG. 1, a semiconductor wafer 100 is shown. The wafer 100 includes a number of distinct semiconductor devices 102 that are manufactured on a single wafer 100, and individually exercised and tested on a wafer tester. Each device 102 that is determined to be fully functional is separated from the wafer, and mounted into a component package (not shown). Devices that fail the wafer test are either thrown away, or examined to determine the cause of their defect. If the devices 102 are memory devices, the defects may be repairable, as will be further discussed below with reference to FIGS. 3 and 4. The devices 102 could be dynamic random access memory (DRAM) chips, static random access memory (SRAM) chips, or in the present embodiment, microprocessors.

Figure 2:
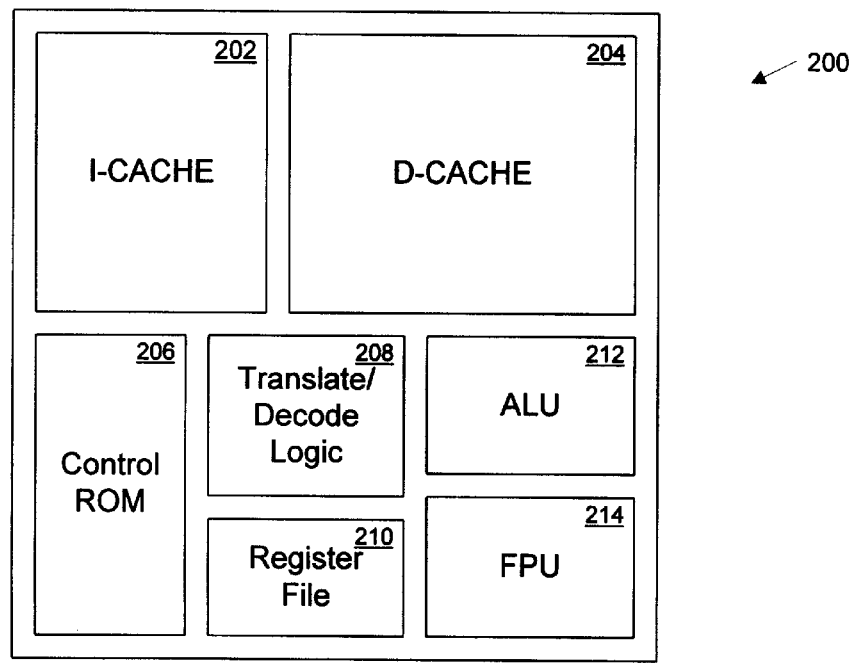
FIG. 2 is a block diagram of a microprocessor, including on-chip memory.

Now referring to FIG. 2, a block diagram is shown that illustrates functional blocks within a microprocessor 200, similar to one of the devices 102 shown in FIG. 1. The microprocessor 200 includes an Instruction Cache 202, a Data Cache 204, a Control ROM 206, Translate/Decode Logic 208, a Register File 210, an Arithmetic Logic Unit 212, and a Floating Point Unit 214.

The Instruction Cache 202 provides temporary storage for processor instructions to be executed by the microprocessor 200. The Data Cache 204 provides temporary storage for data to be operated upon by the microprocessor 200. The Control ROM 206 provides permanent storage for micro instruction sequences that implement the processor instructions stored in the Instruction Cache 202. The Translate/Decode Logic 208 retrieves the processor instructions from the Instruction Cache 202, decodes them, and addresses the Control ROM 206 to select appropriate micro instruction sequences for execution by the microprocessor 200. The Register File 210 provides temporary storage for data, memory addresses and control information that is utilized by the microprocessor 200 during execution of the micro instructions. The Arithmetic Logic Unit 212 performs the mathematical, and logical operations required by the micro instructions. The Floating Point Unit 214 performs floating point operations. One skilled in the art will appreciate that other blocks may exist within the microprocessor 200, but have not been shown, for ease of discussion.

Figure 3:
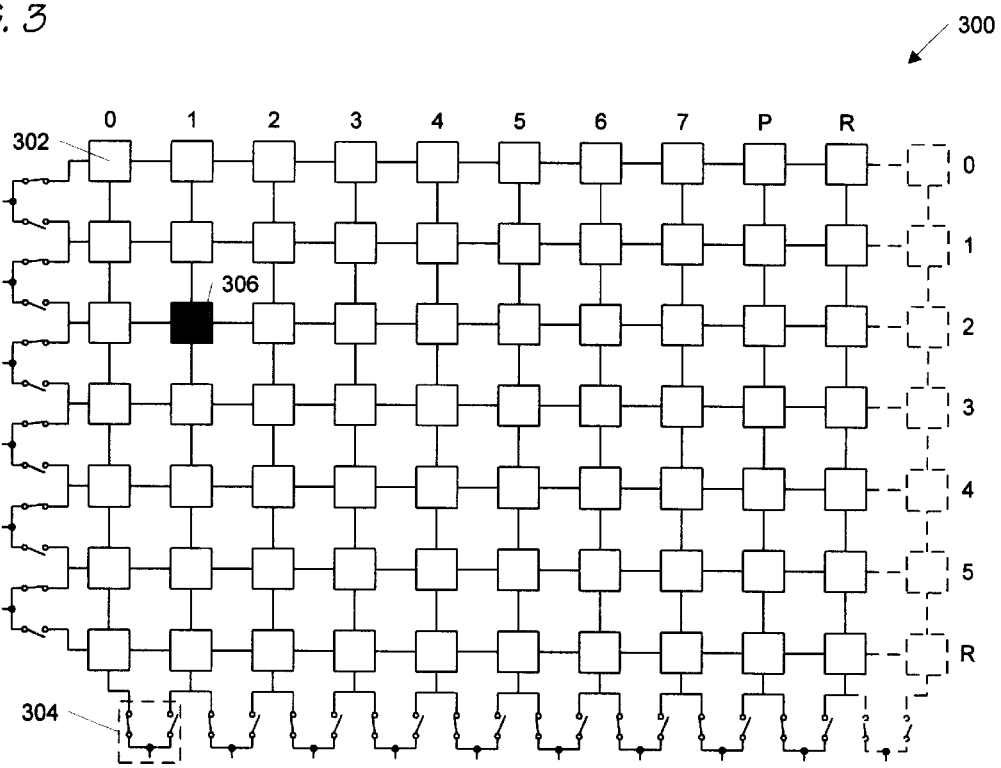
FIG. 3 is a portion of an on-chip memory array, particularly illustrating a redundant column.

Now referring to FIG. 3, a portion 300 of a memory array is shown. The memory array could be either the Instruction Cache 202, or the Data Cache 204, within the microprocessor 200, or could be a dedicated DRAM or SRAM chip, for example. For ease of discussion, the memory array will be treated as the Data Cache 204.

The portion 300 contains a plurality of memory cells 302, arranged into a matrix of rows and columns, as shown. Each of the memory cells 302 is capable of storing a single binary digit (e.g., "0" or "1"). The portion 300 contains eight data columns, labeled 0–7, a parity column, labeled P, and a redundant column, labeled R. In addition, six addressable rows are shown, labeled 0–5, with one redundant row, labeled R.

When the microprocessor 200 wishes to read data stored within the Data Cache 204, for example, an address is provided to the Data Cache 204 to select a particular row, say, row 1. When row 1 is selected, the contents of each of the memory cells 0–7 are output to the microprocessor 200. One skilled in the art will appreciate that modern data caches actually contain more rows and columns than are shown by the portion 300. For example, in the microprocessor incorporating the present invention, the Data Cache is capable of storing 32,768 bytes (8-bit quantities) of data. In one arrangement, the Data Cache has a parity column and a redundant column for every 8 data columns. In addition, a redundant row is provided for every 64 rows of data. However, the ratio of redundant rows/columns to addressable rows/columns is irrelevant to the present invention. Illustration of the present invention may be provided simply by reference to the memory portion 300.

At the bottom of the portion 300 are a plurality of column select switches 304. Each of the column select switches 304 are connected to two adjacent memory columns. For example, columns 0/1 are shown connected to a first column select switch 304, columns 1/2 are shown connected to a second column select switch 304, with the last two columns, P/R connected to the last column select switch. The switches are fabricated such that in a default state, the first column input to each switch is selected as an output. So, the first switch outputs column 0, the second switch outputs column 1, through the last switch that outputs column P. Column R is not selected since it is intended for redundant operation only. The purpose of the switches 304 is to allow one of the columns to be permanently disabled, if defective memory cells are contained therein, and to allow a redundant column to replace the defective column. Also shown are switches connected to adjacent rows 0–R, configured to operate similar to the switches 304 described for the columns.

Figure 4:
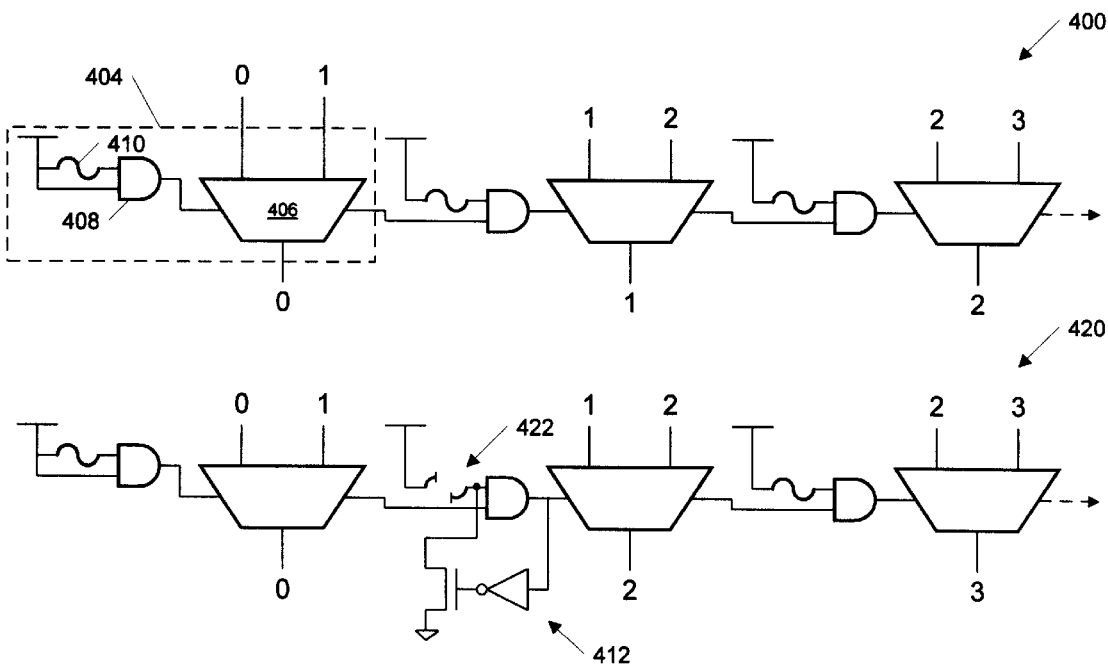
FIG. 4 is a schematic diagram of a switch arrangement for switching in a redundant column within a memory array.

Now referring to FIG. 4, a portion 400 of a plurality of switches 404 is shown in a default configuration. Each of the switches 404 contains a mux 406 having two inputs and a single output. Selection between the two inputs is made via a select line controlled by the output of an AND gate 408. Each of the AND gates 408 has, as one of its inputs, permanent selection logic, such as a fuse 410, connected to a logic high signal. The other input to the AND gates 408 is connected to the select signal of the previous switch 404. The other input to the AND gate 408 of the first switch 404 is connected to a logic high. Thus, in their default state, each of the AND gates 408 have two logic high inputs, and thus a logic high output, causing the first of the two mux inputs to be selected. For portion 400, the first switch 404 selects column 0 to be output, the second switch 404 selects column 1 to be output, and so forth. In one embodiment, similar switches are provided for each of the rows within the memory array.

Now referring to FIGS. 3 and 4, for purposes of illustration if during wafer test the tester exercises the memory portion 300 and determines that a defective memory cell 306 exists in row 1, column 1 of the portion 300, the memory portion 300 is therefore defective. Unless the memory cell 306 can be replaced by a redundant row/column, the entire chip containing the defective memory cell 306 must be thrown away. The tester provides a report on the defective memory cell 306 to a manufacturer. The manufacturer then decides to disable the row or column containing the defective memory cell 306, and replace it with a redundant row or column. The replacement is typically made by removing the wafer from the tester, and by blowing the fuse 410 on the switch 404 whose default condition selected the memory cell 306 as an output.

In the present illustration, the fuse 410 on switch 2 would be blown. Referring specifically to FIG. 4, a portion 420 of the switches 404 is provided that illustrates a blown fuse 422 on switch 2. The blown fuse 422 causes the fuse input to its AND gate to permanently go low, resulting in the output of the AND gate going low, and thereby selecting the second input to the mux to be provided as an output. To insure that the fuse input to the AND gate goes low when the fuse is blown, a circuit 412 is provided between the output of each AND gate, and its fuse input. Thus, switch 2 now selects column 2 rather than column 1 as an output. In addition, since the AND gate output to switch 2 is now low, the select input to the following switch is also low. This causes all following switches to select their second input, rather than their first, to be output. Switch 3 now selects column 3 as an output, switch 4 selects column 4, and so on. In addition, switch 9 now selects the redundant row, rather than the P row. The resulting configuration achieved by blowing the fuse in switch 2, is a memory portion containing 8 data columns, and 1 parity column, with column 1 disabled, and column R enabled.

At this point, the wafer tester detected the defective memory cell 306 and reported the defect to the manufacturer. The manufacturer removed the wafer from the tester, and blew the fuse on the switch associated with column 1. However, it is not yet known whether the memory cells within the redundant column are functional, or whether the redundant column contains a defective memory cell. If the redundant column contains a defective memory cell, then the memory portion is not repairable, and the chip must be discarded. In addition, the expense associated with blowing the fuse to disable column 1, and enable the redundant column, was wasted.

To determine whether the redundant column contains a defective memory cell, the wafer is placed back on the wafer tester, and the memory portion is once again exercised. Since the redundant column is now selected by it switch, the tester can determine whether its memory cells are functional. The tester then reports the status of the redundant column.

One skilled in the art will appreciate that wafer testing of a memory array within a microprocessor, and reporting of defects in the memory array to a manufacturer is known in the art. In addition, removal of the wafer from a tester, to blow a fuse to disable a defective row/column, and re-testing of the memory array to determine whether defects exist in a redundant row/column is also known. What will now be shown is a method and apparatus according to the present invention that allows a redundant row/column to be tested during the first wafer test, without having to blow a fuse, and retest the wafer.

Figure 5:
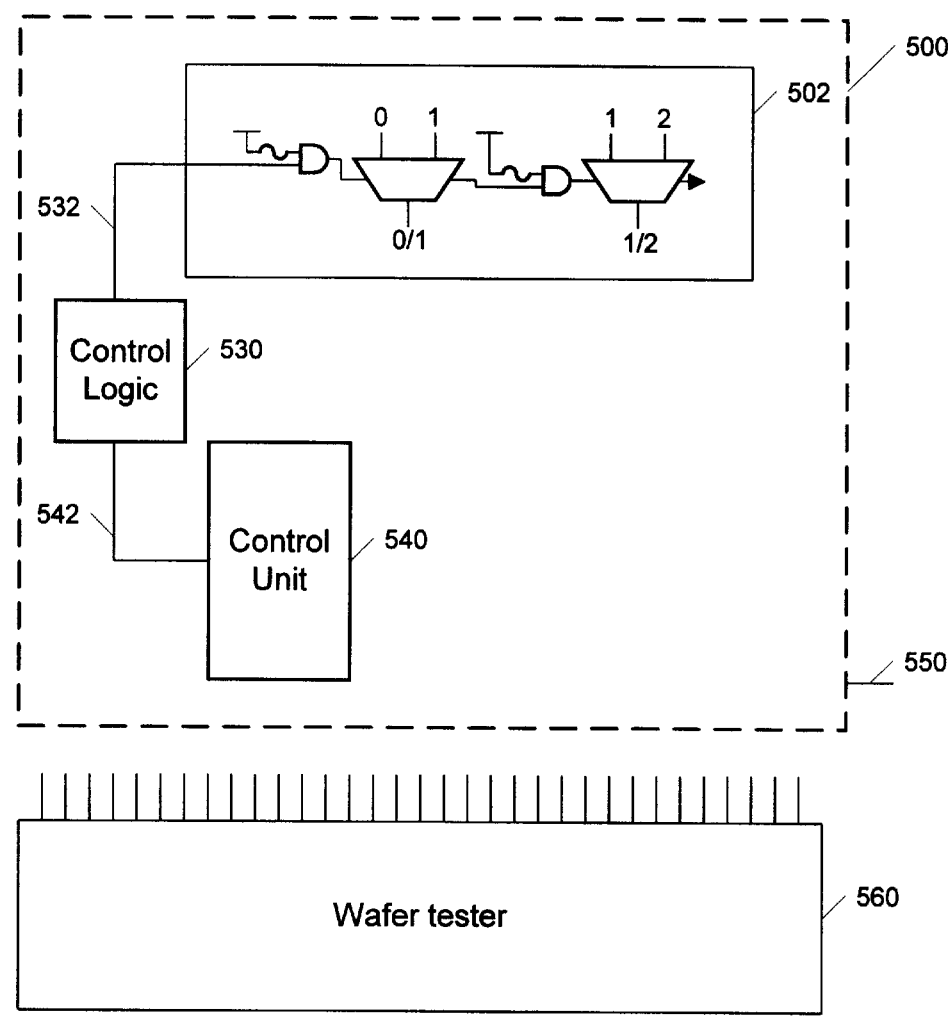
FIG. 5 is a block diagram of a microprocessor incorporating the apparatus and method of the present invention.

Referring to FIG. 5, a microprocessor 500 is shown connected to a wafer tester 560. Logical blocks not directly pertinent to the present invention have been removed for ease of illustration. Within the microprocessor 500 is a plurality of switches 502 for selecting particular columns to be output from a memory array. Operation of the switches 502 is similar to that described above with reference to FIG. 4. However, rather than connecting the second input of the AND gate of the first switch to a logic high, the input is driven by control logic 530 via a select line 532. In one embodiment, the control logic 530 is a flip-flop whose default configuration at power up provides a logic high output on the select line 532.

Thus, during wafer test, all of the switches 502 select as output their first input. The control logic 530 is managed by a control unit 540 via a signal line 542. In one embodiment, the control unit 540 is the control unit for the microprocessor 500, and contains micro instructions for execution by the microprocessor 500. In addition, the control unit 500 contains micro instructions that, upon command by the wafer tester 560, cause the control logic 530 to temporarily provide a logic low signal to be provided to the first switch within the plurality of switches 502. In response, the first switch disables column 0, selects column 1 to be output, and provides a logic low selection to the second switch. The low select signal propagates through all of the switches, causing columns 0–P to be provided by columns 1–R. Thus, without blowing any of the fuses associated with the switches 502, the redundant column has been made available for testing. Specific operation of the control logic 530 to test the redundant column is now provided with reference to FIG. 6.

In an alternative embodiment, a pin 550 is provided on the microprocessor 500 that allows a signal to be provided to the microprocessor 500 from an external source, to either toggle the control logic 530 for selection of the switches 502, or for directly interfacing the switches 502 to an external control source.

Figure 6:
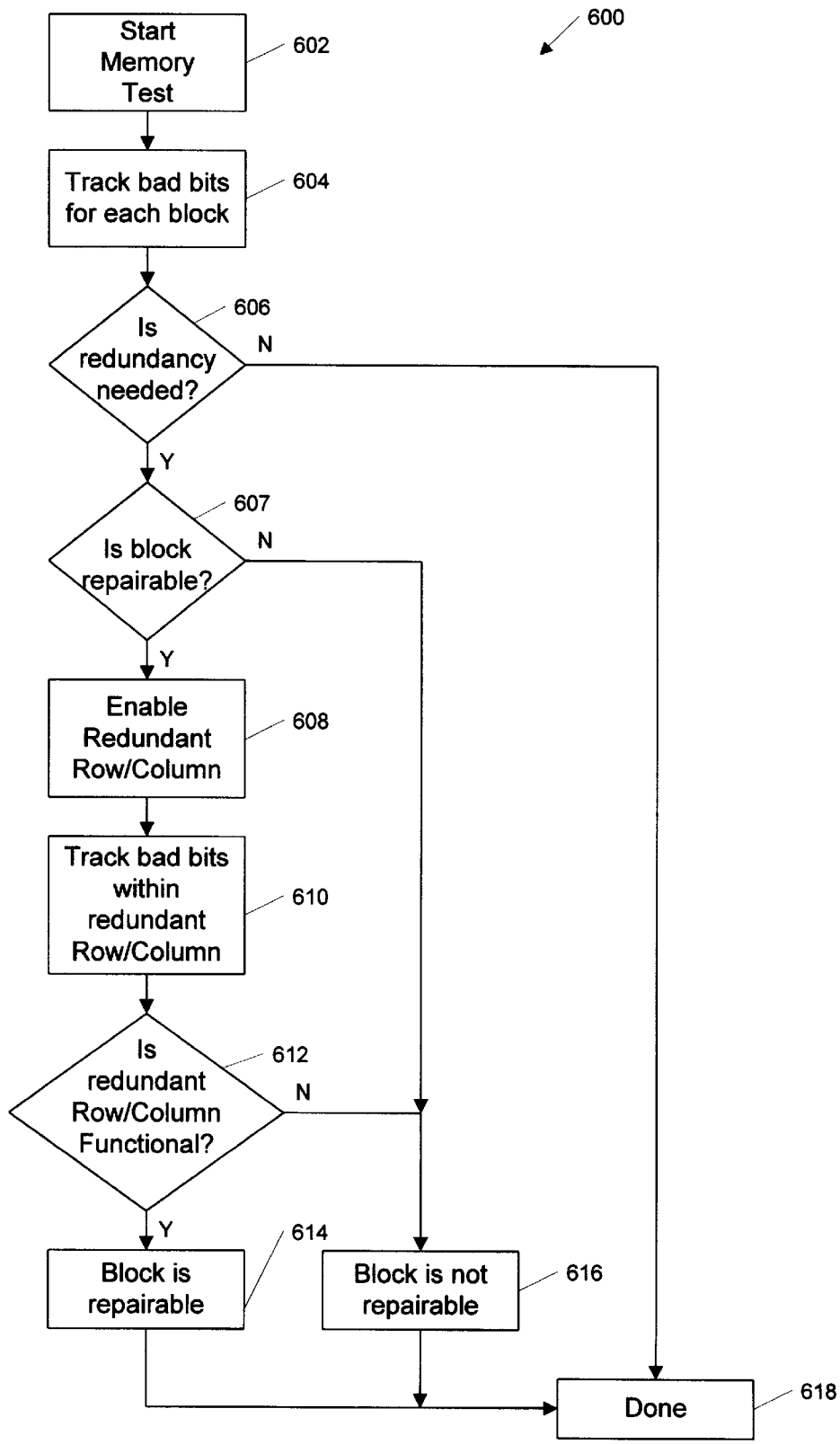
FIG. 6 is a flow chart illustrating the test methodology of the present invention, for testing redundant memory without first blowing a fuse to select the redundant memory.

In FIG. 6, a flow chart 600 is provided that illustrates the steps required to selectively enable/disable rows/columns during wafer test of a memory array, according to the present invention. Memory test begins at block 602.

At block 602 a wafer tester connects to one of the microprocessors on the wafer, and causes the microprocessor to begin exercising its on-chip memory array. For example, the data cache. The memory test is typically performed by writing predetermined patterns to the memory array, reading the patterns back, and comparing the written patterns to the read patterns to determine if any defects exist. Flow then proceeds to block 604.

At block 604 a record is made of each memory cell within the memory array being tested, that returned a data value contrary to what was written. Flow then proceeds to decision block 606.

At decision block 606, a determination is made as to whether any of memory cells within the memory array being tested are defective. If none are defective then the test is complete and flow proceeds to block 618. If any memory cells are defective, the tester proceeds to decision block 607.

At decision block 607, the tester determines whether the defective cells may be repaired by using a redundant row/column. If a redundant row/column is available to repair the defective memory cell, flow proceeds to block 608. If defective cells are present in more than one row/column within a repairable block, the block is not repairable. If this is the case, flow proceeds to block 616.

At block 608 the tester provides an instruction to the microprocessor to cause the control unit 540 to provide a redundant enable signal at the output of the control logic 530. As explained above with reference to FIG. 5, this causes column 0 to be disabled, and causes the redundant column to be enabled. Of course, if the tester determined that what is required is a redundant row rather than a redundant column, a similar switch signal is provided. Flow then proceeds to block 610.

The memory array being tested is again exercised, as in block 602, and defective bits are tracked, as in block 604. It is possible that defects in the memory array other than in the redundant column, may be uncovered during this test, but it is unlikely. However, in addition to exercising the previously tested memory cells in the memory array, the memory cells of the redundant row/column are also exercised. Any errors in the redundant row/column are recorded by the tester. Flow then proceeds to decision block 612.

At decision block 612, a determination is made as to whether the memory cells within the redundant row/column are functional. If so, the memory array is reported as repairable, and flow proceeds to block 618 where the test is complete. If not, the memory array is reported as not repairable, and flow proceeds to block 618 where the test is complete.

If the memory array is repairable, then the tester provides the manufacturer with a list of defects, and an indication of the fuses that must be blown to repair the defects. Since the redundant rows/columns required to repair the defects have already been tested, after blowing the fuses, the chip may be packaged without re-testing.

If the memory array is not repairable, a similar report is made. This report, however, allows the manufacturer to scrap the chip without having to incur the expenses of blowing fuses to enable redundant rows/columns, and retesting the memory array to determine whether defects exist in the redundant rows/columns.

Although the present invention and its objects, features, and advantages have been described in detail, other embodiments are encompassed by the invention. For example, the present invention has been described by reference to testing a data cache within a microprocessor. One skilled in the art will appreciate that the present invention is applicable to testing of any memory array that provides redundant memory cells to replace defective memory cells. Moreover, in the example provided, particular reference has been made to enabling and disabling of memory columns. Although not shown, the invention is equally applicable to the enabling and disabling of memory rows. Furthermore, a particular switch mechanism showed a plurality of muxes whose outputs were selected by AND gates tied to fuses. Such a switch mechanism is common in the art, and allows fuses to disable/enable particular rows/columns. However, alternative mechanisms may be developed to allow selection of two or more columns to be output, based on a controlled input. Use of the present invention to control future switch mechanisms is anticipated by the inventors. Furthermore, one embodiment of the present invention utilizes microcode to interface a microprocessor under test with a wafer tester, and to control the switch selection based on a command from the wafer tester. For a microprocessor, this embodiment is believed to provide an optimum solution. However, for dedicated memory, or for future chips incorporating memory arrays, tester control and selection of redundant rows/columns may be provided via hardware, or other control mechanisms. An important aspect of the present invention is the temporary enabling of redundant circuitry by a wafer tester, for purposes of testing, without requiring alteration of any permanent enabling/disabling mechanism.

Those skilled in the art should appreciate that they can readily use the disclosed conception and specific embodiments as a basis for designing or modifying other structures for carrying out the same purposes of the present invention without departing from the spirit and scope of the invention as defined by the appended claims.

We claim:

1. An apparatus for selectively enabling a redundant memory column within a memory array, the apparatus comprising:

a plurality of adjacent memory columns, wherein at least one of said adjacent memory columns is the redundant memory column;

selection logic, coupled to said plurality of adjacent memory columns, for selecting as an output one of said plurality of adjacent memory columns, wherein said selection logic default selects a first one of said plurality of adjacent memory columns, said selection logic further comprising:

permanent selection logic, causing said selection logic to permanently select as an output a second one of said plurality of adjacent memory columns;

control logic, coupled to said selection logic, causing said selection logic to temporarily select as an output said second one of said plurality of adjacent memory columns, for testing; and a control unit, coupled to said control logic, said control unit having microcode for interfacing to a wafer tester, said microcode causing said control logic to temporarily select as an output said second one of said plurality of adjacent memory columns.

2. The apparatus for selectively enabling a redundant memory column, as recited in claim 1, wherein a memory column comprises a plurality of memory cells for storing binary bits.

3. The apparatus for selectively enabling a redundant memory column, as recited in claim 1, wherein a redundant memory column is a column of memory cells designed to replace a memory column having a defective memory cell.

4. The apparatus for selectively enabling a redundant memory column, as recited in claim 1, wherein said selection logic further comprises:

a mux, coupled to at least two of said plurality of adjacent memory columns; and an AND gate, coupled to a select pin on said mux, for outputting a select signal to select either said first one or said second one of said plurality of adjacent memory columns as an output.

5. The apparatus for selectively enabling a redundant memory column, as recited in claim 4, wherein said permanent selection logic is coupled to a first input to said AND gate.

6. The apparatus for selectively enabling a redundant memory column, as recited in claim 5, wherein if said permanent selection logic is in a default state, said selection logic selects said first one of said plurality of adjacent memory columns as an output.

7. The apparatus for selectively enabling a redundant memory column, as recited in claim 5, wherein if said permanent selection logic is not in a default state (i.e., is blown), said selection logic permanently selects said second one of said plurality of adjacent memory columns as an output.

8. The apparatus for selectively enabling a redundant memory column, as recited in claim 1, wherein said permanent selection logic is a fuse.

9. The apparatus for selectively enabling a redundant memory column, as recited in claim 1, wherein said control logic comprises a flip flop.

10. The apparatus for selectively enabling a redundant memory column, as recited in claim 5, wherein said control logic is coupled to a second input to said AND gate.

11. The apparatus for selectively enabling a redundant memory column, as recited in claim 1, wherein when said control logic is in a default state, it causes said selection logic to select said first one of said adjacent memory columns as an output, unless said permanent selection logic is blown.

12. The apparatus for selectively enabling a redundant memory column, as recited in claim 1, wherein when said control logic is not in a default state, it causes said selection logic to select said second one of said adjacent memory columns, even if said permanent selection logic is in its default state.

13. The apparatus for selectively enabling a redundant memory column, as recited in claim 1, wherein said permanent selection logic is fabricated with a default state.

14. The apparatus for selectively enabling a redundant memory column, as recited in claim 13, wherein said default state may be permanently altered.

15. The apparatus for selectively enabling a redundant memory column, as recited in claim 14, wherein when said default state for said permanent selection logic is altered, said selection logic permanently selects as an output said second one of said plurality of adjacent memory columns.

16. The apparatus for selectively enabling a redundant memory column, as recited in claim 1, wherein said second one of said plurality of adjacent memory columns is the redundant memory column.

17. A microprocessor having a data cache, the data cache having a plurality of addressable memory rows, each of the memory rows having a plurality of memory columns, the microprocessor comprising:

a redundant memory column, for replacing one of said plurality of memory columns, if a defective memory cell is found within said one of said plurality of memory columns;

switch logic, coupled to the plurality of memory columns, and to said redundant memory column, said switch logic default enabling all of the plurality of memory columns, and disabling said redundant memory column;

permanently alterable switch control, coupled to said switch logic, for permanently disabling one of the plurality of memory columns, and for permanently enabling said redundant memory column; and a control unit, coupled to said switch logic, said control unit having microcode for interfacing to a wafer tester, said microcode causing said switch logic to temporarily select as an output said redundant memory column.

18. The microprocessor, as recited in claim 17 wherein said switch logic further comprises:

a plurality of muxes, each coupled to two adjacent memory columns, and having a default select, said muxes for selecting one of the two adjacent memory columns as an output;

wherein one of said plurality of muxes is coupled to one of the plurality of memory columns, and to said redundant memory column.

19. The microprocessor, as recited in claim 18, wherein said plurality of muxes default select a first one of the two adjacent memory columns as an output.

20. The microprocessor, as recited in claim 19, wherein if said permanently alterable switch control is altered, at least one of said plurality of muxes selects a second one of the two adjacent memory columns as an output.

21. The microprocessor, as recited in claim 18, wherein if said permanently alterable switch control is not altered, said control unit temporarily disables said one of said plurality of memory columns, and temporarily enables said redundant memory column, to determine whether said redundant memory column contains any defective memory cells.

22. A method for testing a memory array during wafer test, the method comprising:

exercising the memory array to determine if memory cells are defective;

tracking which of the memory cells, if any, are defective;

if a memory cell is defective, temporarily disabling a row or column, and temporarily enabling the redundant memory row or column, wherein said temporarily disabling a row or column is performed by selection logic that temporarily switches the row or column output by the memory array; and exercising the memory array to determine if any memory cells in the redundant row or column are defective.

23. The method for testing a memory array, as recited in claim 22, wherein said step of exercising the memory array comprises:

writing a predetermined data pattern to a row within the memory array;

reading the row within the memory array; and comparing the written data pattern to the read row to determine if any memory cells within the row are defective.

24. The method for testing a memory array, as recited in claim 23, wherein said step of exercising the memory array further comprises the step of repeating said steps of writing, reading and comparing, for all rows in the memory array.

25. The method for testing a memory array, as recited in claim 23, wherein said step of tracking comprises recording the column of any memory cells within the row that are defective.

* * * * *